United States Patent
Ang et al.

(10) Patent No.: US 7,473,986 B2
(45) Date of Patent: Jan. 6, 2009

(54) POSITIVE-INTRINSIC-NEGATIVE (PIN) DIODE SEMICONDUCTOR DEVICES AND FABRICATION METHODS THEREOF

(75) Inventors: Kern-Huat Ang, Johor (MY); Ling-Sung Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 124 days.

(21) Appl. No.: 11/563,814

(22) Filed: Nov. 28, 2006

(65) Prior Publication Data
US 2008/0073755 A1 Mar. 27, 2008

Related U.S. Application Data

(60) Provisional application No. 60/826,550, filed on Sep. 22, 2006.

(51) Int. Cl.
*H01L 29/00* (2006.01)
(52) U.S. Cl. .............. 257/656; 257/E29.336; 257/E21.577; 438/675
(58) Field of Classification Search ........ 257/655, 257/656, 657, E21.577, E21.578, E29.336; 438/100, 101, 478, 510, 514, 584, 597, 669, 438/672, 674, 675
See application file for complete search history.

(56) References Cited

U.S. PATENT DOCUMENTS

| | | | |
|---|---|---|---|
| 6,034,882 A | 3/2000 | Johnson et al. | |
| 6,420,215 B1 | 7/2002 | Knall et al. | |
| 6,490,218 B1 | 12/2002 | Vyvoda et al. | |
| 6,525,953 B1 | 2/2003 | Johnson | |
| 6,952,030 B2 | 10/2005 | Herner et al. | |
| 6,960,495 B2 | 11/2005 | Vyvoda et al. | |
| 7,026,212 B2 | 4/2006 | Herner et al. | |
| 2001/0020712 A1* | 9/2001 | Raaijmakers et al. | 257/301 |
| 2003/0064572 A1 | 4/2003 | Johnson | |
| 2005/0098800 A1* | 5/2005 | Herner et al. | 257/209 |

* cited by examiner

*Primary Examiner*—Evan Pert
*Assistant Examiner*—Kevin Quinto
(74) *Attorney, Agent, or Firm*—Thomas, Kayden, Horstemeyer & Risley

(57) ABSTRACT

Semiconductor devices and fabrication methods thereof. A first dielectric layer with a first conductor line along a first direction is disposed on a semiconductor substrate, wherein the top surface of the first conductor line is lower than the top surface of the first dielectric layer. A second dielectric layer comprising an opening corresponding to the first diode element is disposed on the first dielectric layer. A semiconductor diode component comprises a first diode element disposed on the first conductor line, wherein the top surface of the first diode element is level with the top surface of the first dielectric layer; and a second diode element and a third diode element are filled in the opening.

30 Claims, 9 Drawing Sheets

POSITIVE-INTRINSIC-NEGATIVE (PIN) DIODE SEMICONDUCTOR DEVICES AND FABRICATION METHODS THEREOF

CROSS REFERENCE TO RELATED APPLICATIONS

This application claims the benefit of U.S. Provisional Application No. 60/826,550 filed on Sep. 22, 2006, the entirety of which is incorporated herein by reference.

BACKGROUND OF THE INVENTION

1. Field of the Invention

The invention relates to semiconductor devices, and more particularly to PIN diode devices and fabrication methods thereof.

2. Description of the Related Art

Memory arrays that use an anti-fuse layer to store digital data are well known. Vyvoda, in U.S. Pat. No. 6,490,218, the entirety of which is hereby incorporated by reference, discloses a digital memory method and system for storing multiple bit digital data. The memory arrays include three-dimensional memory cell arrays. Each memory cell includes a diode and an anti-fuse layer. The anti-fuse layer acts initially as an insulator, blocking forward current through the memory cell. The memory cell can be programmed by sending a write voltage/current through the memory cell to disrupt the anti-fuse layer, thereby lowering the resistance of the memory cell. The contents of the memory cell can be read as logic 1 if the memory cell resistance is in a lower range, indicating that the anti-fuse layer has been disrupted, and as logic 0 if the resistance is at a higher initial level.

Johnson, in U.S. Pat. No. 6,525,953 and in publication No. 2003/0064572, the entirety of which are hereby incorporated by reference, discloses an exemplary vertically-stacked, field-programmable, nonvolatile memory and a method of fabricating the same. Furthermore, U.S. Pat. Nos. 6,591,394, 6,624,485, 6,627,530, 6,631,085, and 6,653,712, the entirety of which are hereby incorporated by reference, also disclose some different vertically-stacked, field-programmable, nonvolatile memory devices.

FIG. 1A shows a conventional one-time programmable memory cell with an anti-fuse layer. FIG. 1B is an equivalent circuit diagram of the conventional one-time programmable memory cell of FIG. 1A. The semiconductor memory cell 1 has two explicit terminals, a word line 10 and a bit line 11. Between these terminals, the memory cell contains a pillar 12 of layers comprising a P-type doped silicon layer 13, an undoped silicon layer 15, an N-type doped silicon layer 14, and an anti-fuse layer 16. The anti-fuse layer 16 acts initially as an insulator, and in this state no diode is formed. When the anti-fuse layer 16 is disrupted, at least part of the first diode component consisting of the P-type doped silicon layer 13 contacts the second diode component consisting of the N-type doped silicon layer 14, thereby forming a PIN diode 12 serving as a switch.

Once formed, the PIN diode 12 exhibits a strongly asymmetric current-versus-voltage characteristic, i.e., conducting current more readily in one direction than the other. The purpose of the PIN diode 12 is to ensure that current through the memory cell is substantially unidirectional. This unidirectional behavior enables the memory decoders to establish a unique circuit path to each individual memory cell, allowing it to be individually accessed for read and write regardless of the state of all other cells.

U.S. Pat. Nos. 7,026,212, 6,952,030, and 6,960,495, the entirety of which are hereby incorporated by reference, disclose three-dimensional monolithic memory cells and fabrication methods thereof. The arrangement of process steps and the choice of materials decrease aspect ratio of each memory cell, improving the reliability of gap fill and preventing etch undercut.

FIGS. 2A-2E are cross sections of conventional fabrication of a one-time programmable memory cell. Referring to FIG. 2A, a semiconductor substrate 100 is provided. A buffer layer 110 and a first conductor layer 120 are sequentially deposited on the semiconductor substrate 100. The semiconductor substrate 100 includes a single crystal silicon substrate, a silicon-on-sapphire (SOS) substrate, a dielectrically isolated substrate, or a silicon-on-insulator (SOI) substrate. The buffer layer 110 includes TiN, Ta, and TaN to serve as an adhesion layer or a diffusion barrier layer. The first conductor layer 120 can be tungsten, aluminum, copper, or a doped silicon layer.

Referring to FIG. 2B, the buffer layer 110 and the first conductor layer 120 are etched to create conductive lines 115a and 115b along a first direction (i.e., x-direction). A first dielectric layer 150 is formed on the semiconductor substrate 110 and planarized to expose the conductive lines 115a and 115b as shown in FIG. 2C. The material of the first dielectric layer 150 can comprise $SiO_2$, borosilicate glass (BSG), borophosphate silicate glass (BPSG), fluorosilicate glass (FSG), or tetra-ethyl-ortho-silicate (TEOS).

Referring to FIG. 2D, a glue layer 155 is formed on the dielectric layer 150. A PIN hybrid silicon layer 170 comprising $N^+$-type doped silicon 160a, undoped amorphous silicon 160b and $P^+$-type doped silicon 160c is formed on the glue layer 155. The PIN hybrid silicon layer 170 is patterned into semiconductor pillars 170a and 170b to serve as PIN diodes, as shown in FIG. 2E.

However, conventional fabrication of the pillar PIN diode and connection lines is difficult. None of the word line, bit line, or pillar of layers is formed in the planar substrate. Typically, the pillar PIN diode is formed by layer deposition and subsequent patterning to define the pillar. The reduction in memory size accompanying an increased number of devices results in a more narrow process window for patterning the deposited layers by etching. As the memory cell shrinks, the pillar PIN diode of memory cell smaller than 80×80 nm² is formed using hard mask etching with very high aspect ratio exceeding 5. The pillar PIN diodes, however, are difficult to pattern using conventional line/space etching processes.

BRIEF SUMMARY OF THE INVENTION

Accordingly, the invention overcomes the shortcomings described and achieves other advantages. Methods of fabricating semiconductor devices are provided to prevent PIN diode lifting in the pillar and enlarge the process window to improve yield.

A semiconductor device is provided. A first dielectric layer with a first conductor line along a first direction is disposed on a semiconductor substrate, wherein the top surface of the first conductor line is lower than the top surface of the first dielectric layer. A second dielectric layer comprising an opening corresponding to the first diode element is disposed on the first dielectric layer. A semiconductor diode component comprises a first diode element disposed on the first conductor line, wherein the top surface of the first diode element is level with the top surface of the first dielectric layer; and a second diode element and a third diode element filled in the opening.

The invention further provides another semiconductor device comprising a semiconductor substrate. A first dielectric layer with a first conductor line along a first direction is disposed on the semiconductor substrate, wherein the top surface of the first conductor line is lower than the top surface of the first dielectric layer. A second dielectric layer comprising a first opening and a second opening is on the first dielectric layer. A first semiconductor diode component comprises a first diode element disposed on the first conductor line, wherein the top surface of the first diode element is level with the top surface of the first dielectric layer, and a second diode element and a third diode element filled in the first opening. A second semiconductor diode component comprises a fourth diode element disposed on the first conductor line, wherein the top surface of the first diode element is level with the top surface of the first dielectric layer; and a fifth diode element and a sixth diode element are filled in the second opening. The first diode element and the fourth diode element are inversely type doped silicon. The third diode element and the sixth diode element are inversely type doped silicon.

A method for fabricating a semiconductor device is also provided. A first dielectric layer with a first conductor line along a first direction is formed on a semiconductor substrate, wherein the top surface of the first conductor line is lower than the top surface of the first dielectric layer. A semiconductor diode component is formed by forming a first diode element on the first conductor line, wherein the top surface of the first diode element is level with the top surface of the first dielectric layer; and forming a second dielectric layer on the first dielectric layer, the second dielectric layer comprising an, opening corresponding to the first diode element. The opening is filled with a second diode element and a third diode element.

The invention further provides another method for fabricating a semiconductor device, comprising providing a semiconductor substrate; forming the first dielectric layer with a trench therein; conformably depositing a buffer layer and a first conductive layer on the first dielectric layer filling the trench; planarizing the buffer layer and the first conductive layer until exposing the first dielectric layer; etching the buffer layer and the first conductive layer such that the top surface of the first conductor line is lower than the top surface of the first dielectric layer; forming a first diode element on the first conductor line, wherein the top surface of the first diode element is level with the top surface of the first dielectric layer; forming a second dielectric layer on the first dielectric layer, the second dielectric layer comprising an opening corresponding to the first diode element; filling the opening with a second diode element and a third diode element.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides two step damascene formations with two cycles of metal and silicon depositions followed by chemical mechanical planarization (CMP) or etch back process and damascene formation of the columnar PIN diode in the etched hole of the dielectric layer, thereby enlarging the process window for etching the dielectric layer.

A semiconductor device is provided. A first dielectric layer with a first conductor line along a first direction is disposed on a semiconductor substrate, wherein the top surface of the first conductor line is lower than the top surface of the first dielectric layer. A second dielectric layer comprising an opening corresponding to the first diode element is disposed on the first dielectric layer. A semiconductor diode component comprises a first diode element disposed on the first conductor line, wherein the top surface of the first diode element is level with the top surface of the first dielectric layer; and a second diode element and a third diode element filled in the opening.

FIGS. 3A through 3I are cross-sections of an exemplary embodiment showing fabrication steps of a semiconductor PIN diode device of the invention.

Figure 1A:
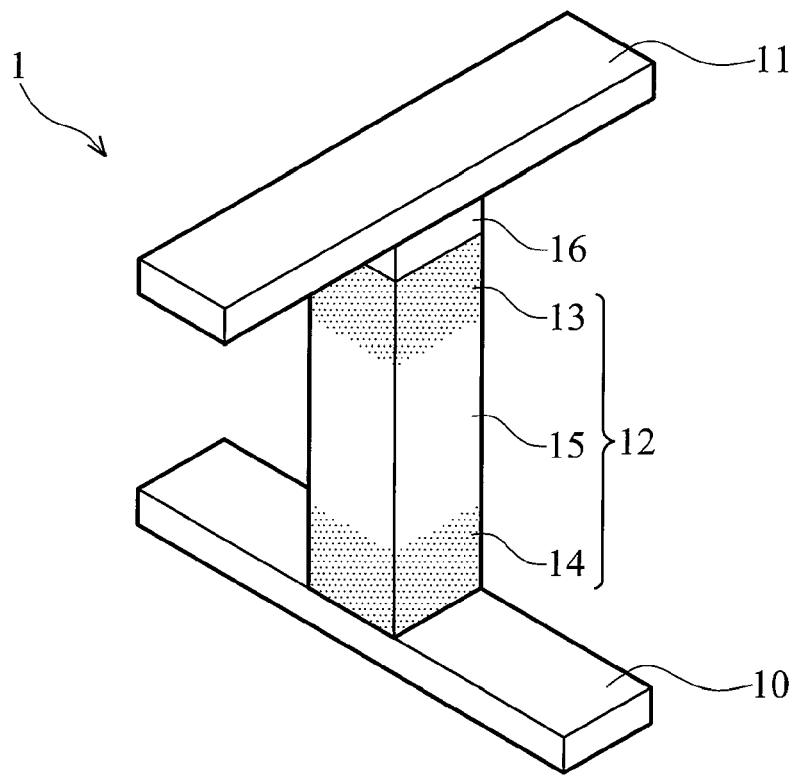
FIG. 1A shows a conventional one-time programmable memory cell of the background art with an anti-fuse layer.
Figure 1B:
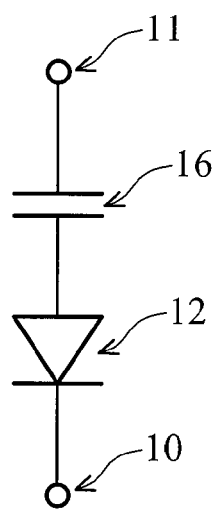
FIG. 1B is an equivalent circuit diagram of the conventional one-time programmable memory cell of FIG. 1A.
Figure 2A:
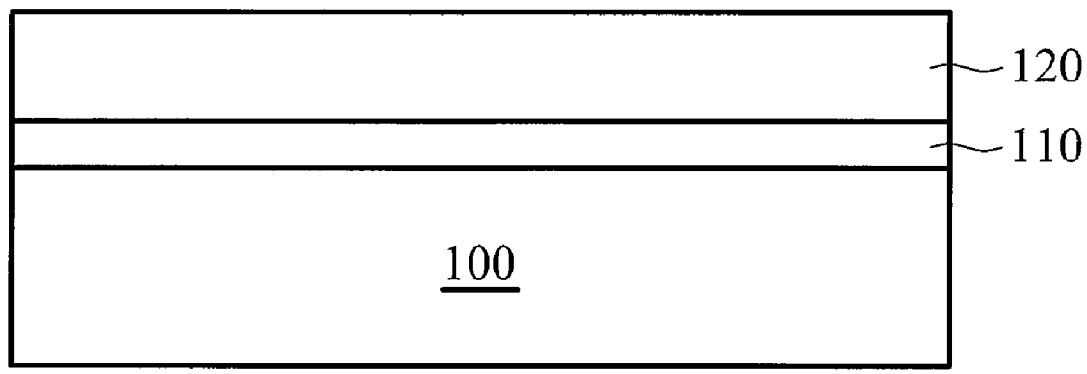
FIGS. 2A-2E are cross sections of conventional fabrication steps for a semiconductor PIN diode device.
Figure 2B:
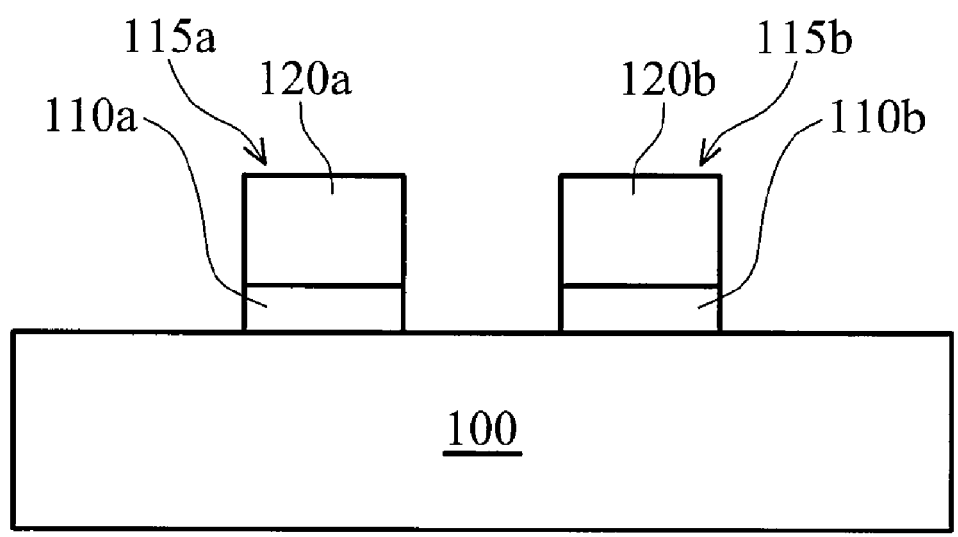
Figure 2C:
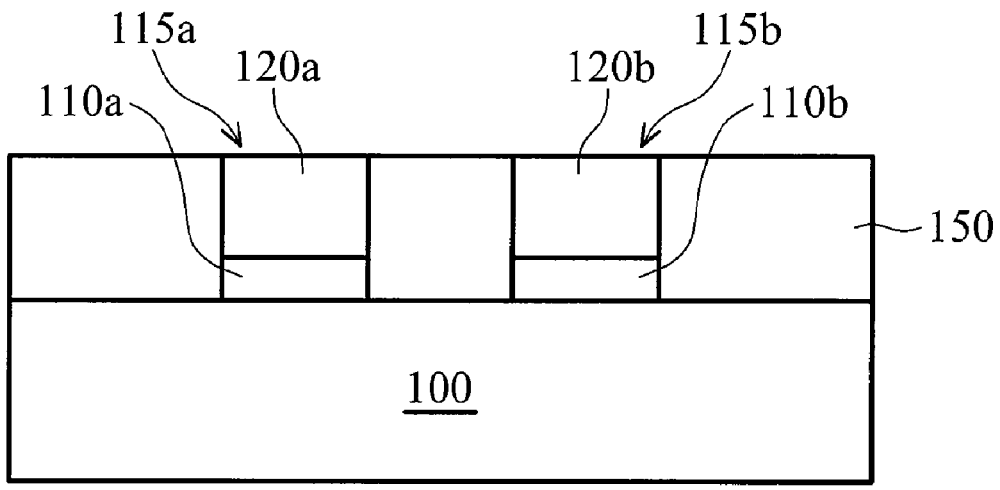
Figure 2D:
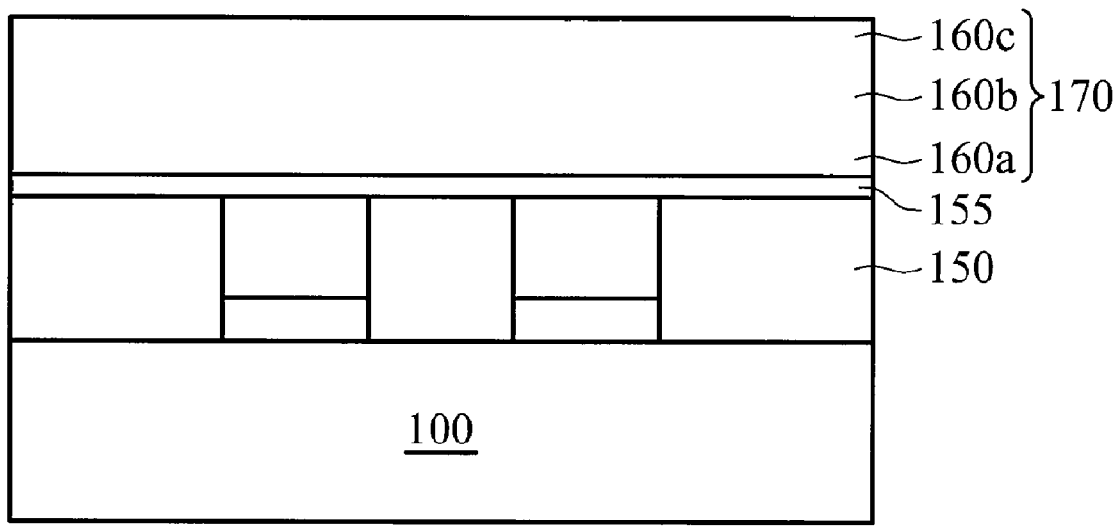
Figure 2E:
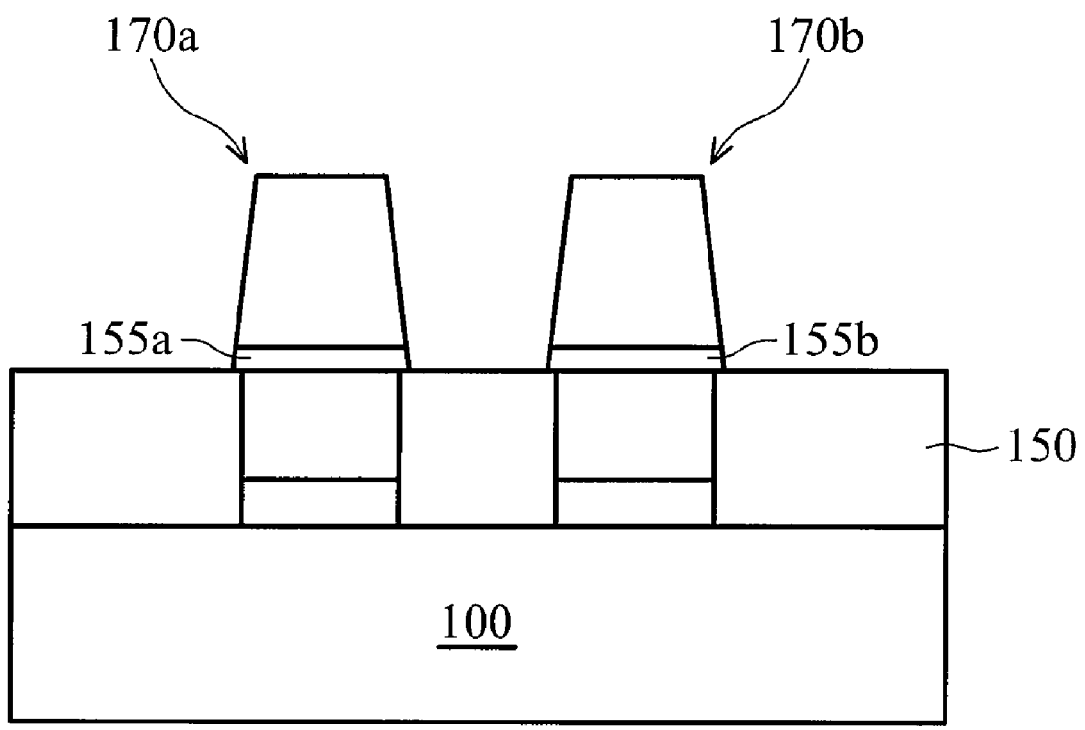
Figure 3A:
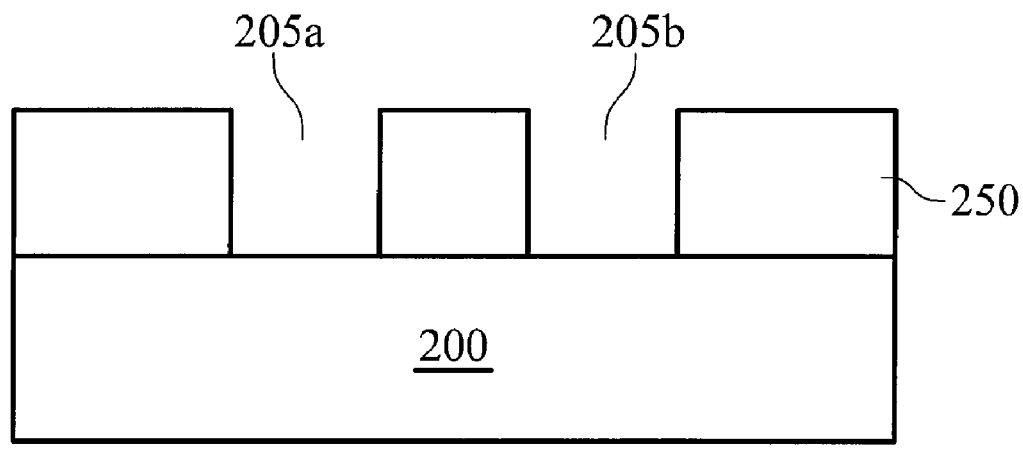
FIGS. 3A through 3I are cross-sections of an exemplary embodiment showing fabrication steps of a semiconductor PIN diode device of the invention.

Referring to FIG. 3A, a semiconductor substrate 200 is provided. The semiconductor substrate 200 preferably comprises a single crystal silicon substrate, a silicon-on-sapphire (SOS) substrate, a dielectrically isolated substrate, a USG HDP dielectric substrate or a silicon-on-insulator (SOI) substrate. A first dielectric layer 250 is formed on the semiconductor substrate 200. Trenches 205a and 205b are formed in the first dielectric layer 250 by lithograph etching. The material of the dielectric layer 250 can comprise $SiO_2$, borosilicate glass (BSG), borophosphate silicate glass (BPSG), fluorosilicate glass (FSG), USG, HDP or tetra-ethyl-ortho-silicate (TEOS) formed by deposition as is well known in the art.

Conductive line structure 215a, 215b and first diode element 245a, 245b are sequentially formed in the trenches 205a and 205b using two step damascene formations with two cycles of metal and silicon deposition followed by chemical mechanical planarization (CMP) or etch back process.

Figure 3B:
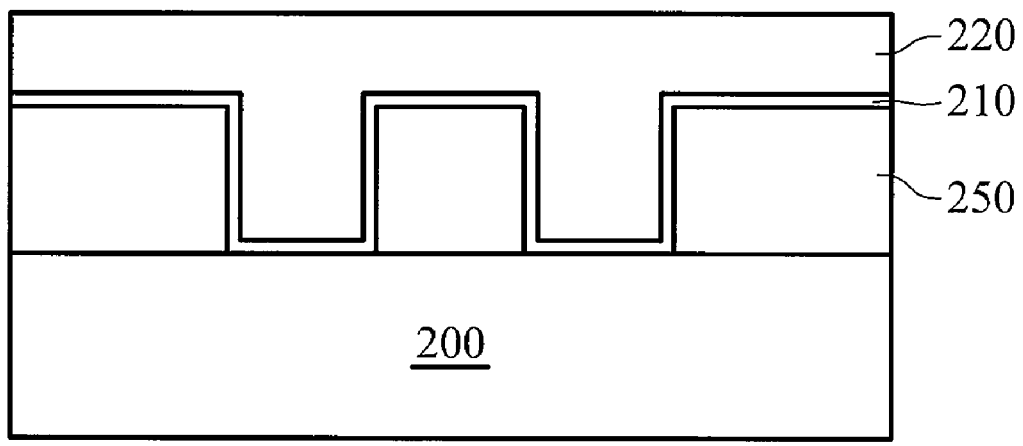

Referring to FIG. 3B, a buffer layer 210 and a first conductor layer 220 are conformably deposited on the first dielectric layer 250 filling the trenches 205a and 205b. The buffer layer 210 comprises TiN, Ta, TaN, AlN, TiAlN, or combination thereof to serve as an adhesion layer or a diffusion barrier layer. The first conductor layer 220 can be tungsten (W), aluminum (Al), copper (Cu), metal silicide, undoped silicon or a doped silicon layer.

Figure 3C:
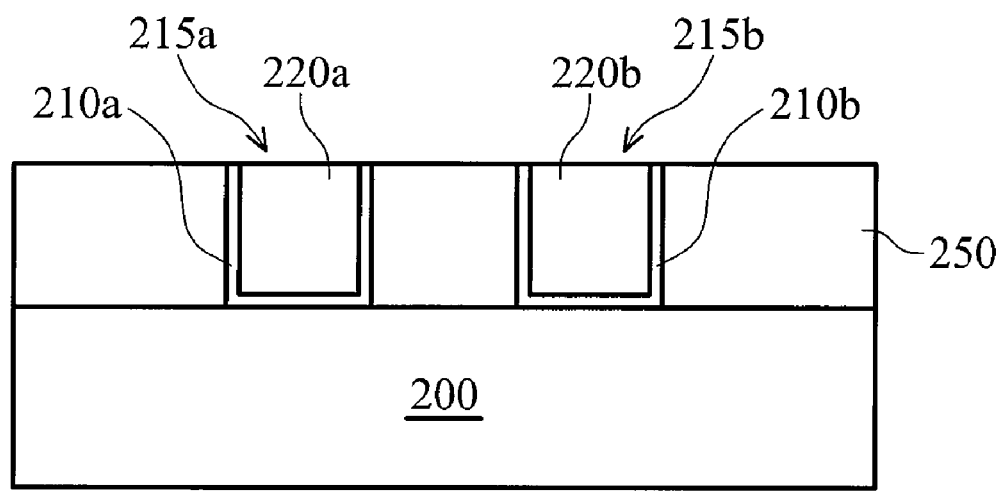
Figure 3D:
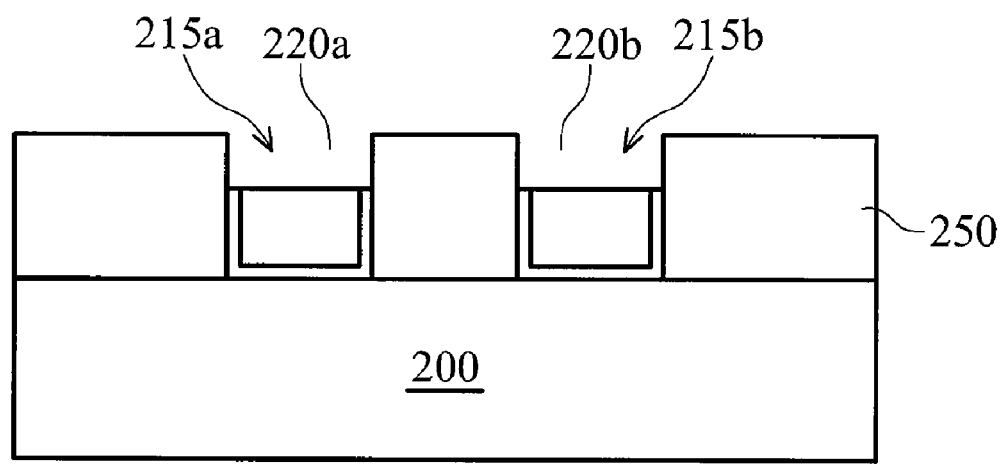

Referring to FIG. 3C, the buffer layer 210 and the first conductor layer 220 are planarized preferably by CMP or etch back to expose top surface of the first dielectric 250. Anisotropic etching or isotropic etching is sequentially performed on the buffer layer 210 and the first conductor layer 220 to create shallow trenches 220a and 220b on the conductive line structure 215a, 215b as shown in FIG. 3D. The shallow trenches 220a and 220b can be also totally etched away by etching process without the first CMP process. The step height between the first conductive line structure 215a, 215b and the first dielectric layer 250 is preferably less than 1000 Å.

Figure 3E:
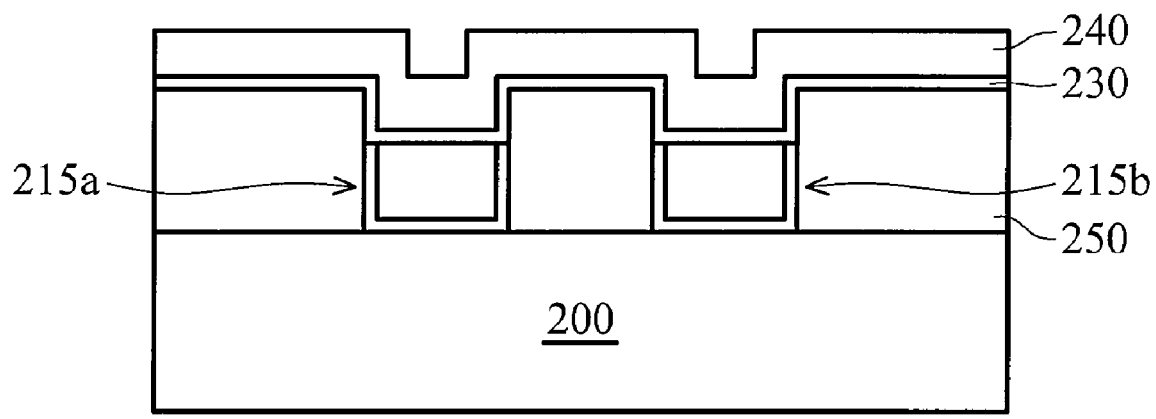
Figure 3F:
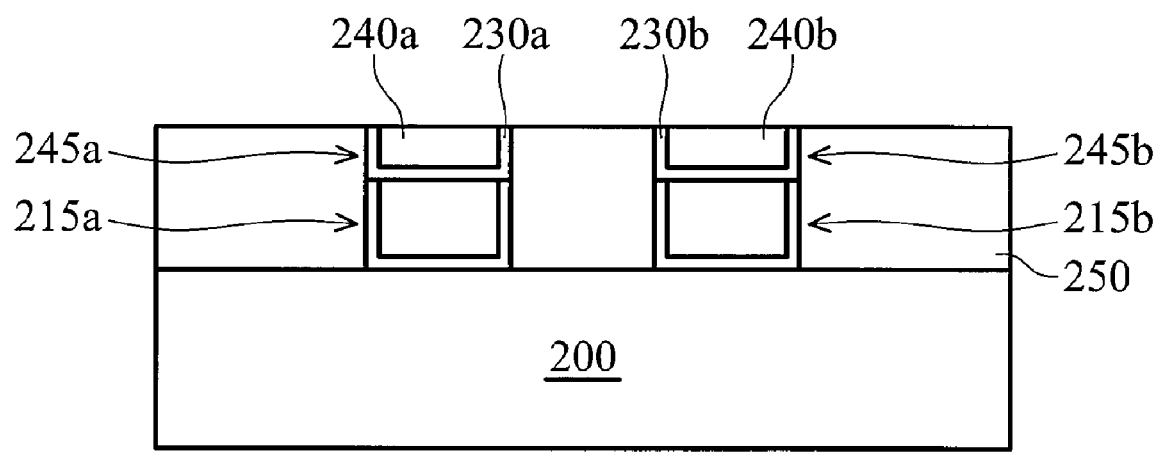

Referring to FIG. 3E, a glue layer 230 and a first diode element layer 240 are conformably deposited on the first dielectric layer 250 filling the shallow trenches 220a and 220b. The first diode element layer 240 comprises a first type, e.g., $P^+$-type or $N^+$-type, doped silicon layer preferably formed by deposition, such as chemical vapor deposition (CVD). In this embodiment, the formation of the $P^+$-type doped silicon layer 240 is accomplished by depositing a Si layer with $P^+$-type dopants. Suitable $P^+$-type dopants comprise boron (B), Gallium (Ga), or indium (In).

The glue layer 230 and the first diode element layer 240 are planarized preferably by CMP to expose top surface of the first dielectric 250. The first diode elements 245a, 245b are thus formed on the first conductive line structure 215a, 215b. The invention provides a first damascene procedure to form the first conductive line structure 215a, 215b at lower portion of the trenches 205a and 205b, and a second damascene procedure to form the first diode elements 245a, 245b at upper portion of the trenches 205a and 205b.

Figure 3G:
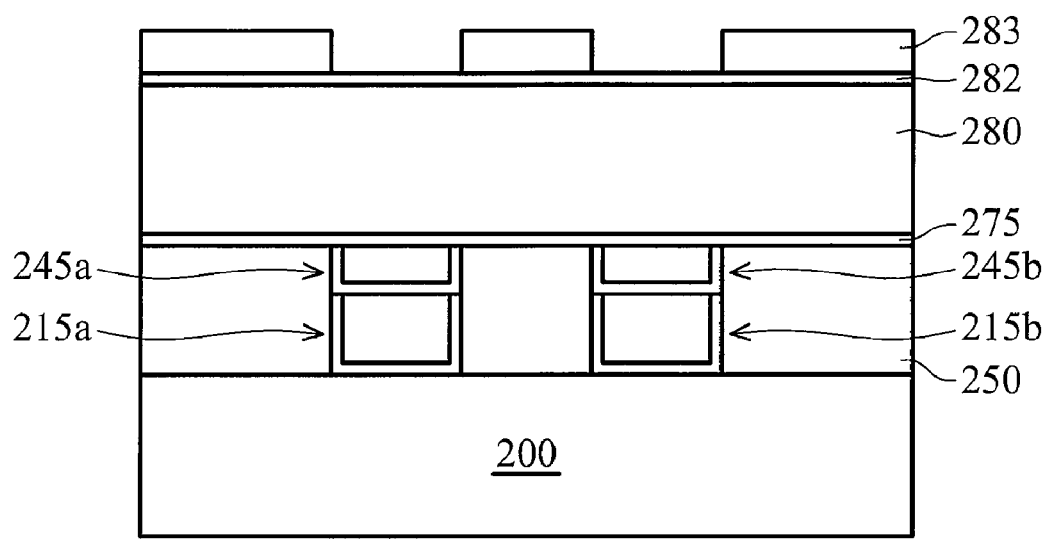

Referring to FIG. 3G, an etching stop layer 275, a second dielectric layer 280, and a hard mask layer 282 are sequentially formed on the first dielectric layer 250. A patterned photoresist 283 is applied on the hard mask layer 282 with openings corresponding to semiconductor diode pillars. The stop layer 275 and hard mask layer 282 are an option processes depending on process integration. The material of the second dielectric layer 280 can comprise $SiO_2$, borosilicate glass (BSG), borophosphate silicate glass (BPSG), fluorosilicate glass (FSG), USG, HDP or tetra-ethyl-ortho-silicate (TEOS) formed by deposition as is well known in the art.

Figure 3H:
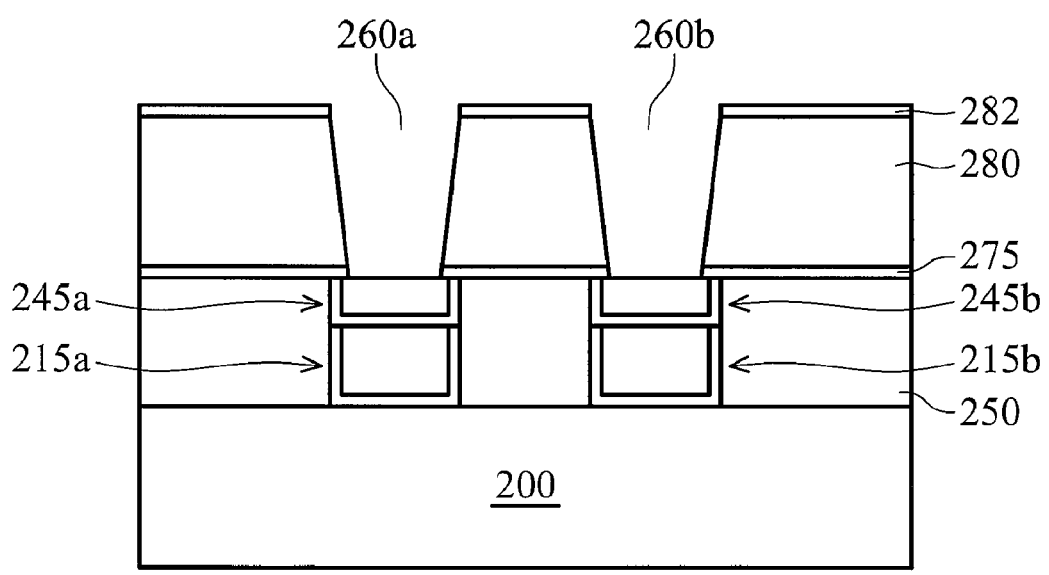

Referring to FIG. 3H, anisotropic etching is performed to create openings 260a and 260b in the second dielectric layer 280 to expose the surface of the first diode elements 245a and 245b corresponding to semiconductor diode pillars.

Figure 3I:
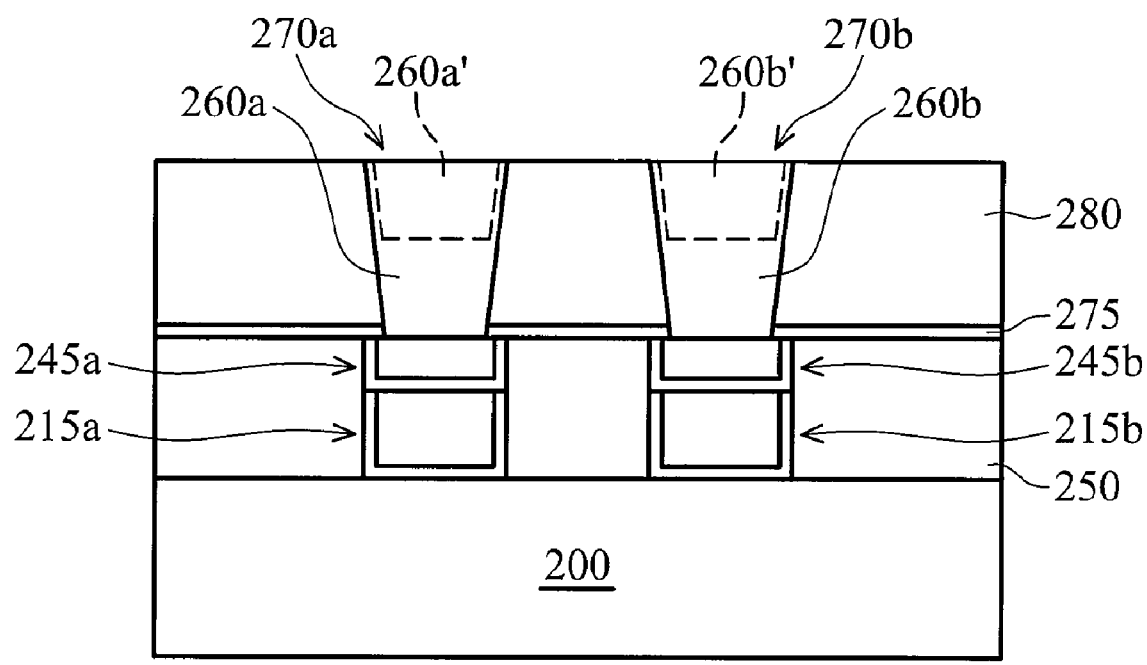

Referring to FIG. 3I, a silicon layer 260 is deposited on the second dielectric layer 280 filling the openings 260a and 260b. The silicon layer 260 can be intrinsic or undoped silicon. More specifically, intrinsic silicon 260a and 260b can initially be deposited in the openings followed by doping with second type dopants, e.g., $N^+$-type dopant. The $N^+$-type dopants comprise phosphorous (P) or arsenic (As). The silicon layer is then planarized by, for example, chemical mechanical polishing (CMP) until the second dielectric layer 280 is exposed. As such, intrinsic silicon 260a and 260b are formed in lower portion of the openings serving as second diode elements and $N^+$-type doped silicon 260a' and 260b' are formed in upper portion of the openings serving as third diode elements. According to an embodiment of the invention, the first diode elements 245a, 245b, the second diode elements 260a, 260b, and the third diode elements 260a', 260b' are composed of PIN semiconductor diode components.

Alternatively, intrinsic silicon 260a and 260b can initially be deposited in the openings and planarized by CMP. After CMP, the intrinsic silicon 260a and 260b is subjected to an $N^+$-type ion implantation. Thus, $N^+$-type doped silicon regions 260a', 260b' are formed at the upper portion of the silicon 260a and 260b.

The first diode elements 245a and 245b can also be inversely type doped silicon, and the third diode elements 260a' and 260b' can be inversely type doped silicon. For example, the first diode element 245a is a $P^+$-type doped silicon and the third diode element 260a' is an $N^+$-type doped silicon. The first diode element 245a, the second diode element 260a, and the third diode element 260a' are composed of a first semiconductor diode component serving as a switch. The first diode element 245b is an $N^+$-type doped silicon and the third diode element 260b' is a $P^+$-type doped silicon. The first diode element 245b, the second diode element 260b, and the third diode element 260b' are composed of a second semiconductor diode component serving as an inversed switch.

Note that the PIN diode devices of the invention can be applicable to memory devices, one time programmable memory cells, application-specific integrated circuits (ASIC), but not limited thereto, other semiconductor devices can also applicable thereto.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a semiconductor substrate;
   a first dielectric layer with a first conductor line along a first direction disposed on the semiconductor substrate, wherein the top surface of the first conductor line is lower than the top surface of the first dielectric layer;
   a second dielectric layer comprising an opening corresponding to a first semiconductor diode element disposed on the first dielectric layer; and
   a semiconductor diode component comprising:
      the first semiconductor diode element disposed on the first conductor line, wherein the top surface of the first semiconductor diode element is level with the top surface of the first dielectric layer; and
      a second semiconductor diode element and a third semiconductor diode element filled in the opening.

2. The semiconductor device as claimed in claim 1, further comprising a buffer layer conformably disposed on an interface between the first semiconductor diode element and the first conductor line and on interfaces between the first semiconductor diode element and the first dielectric layer, wherein the buffer layer comprises TiN, Ta, TaN, AlN, TiAlN, or combination thereof.

3. The semiconductor device as claimed in claim 1, wherein the first conductive line comprises tungsten (W), aluminum (Al), copper (Cu), metal silicide, undoped silicon or a doped silicon layer.

4. The semiconductor device as claimed in claim 1, wherein a step height between the first conductor line and the first dielectric layer is less than 1000 Å.

5. The semiconductor device as claimed in claim 1, wherein the semiconductor diode component comprises a PIN diode.

6. The semiconductor device as claimed in claim 1, wherein the first semiconductor diode element comprises a first type doped semiconductor.

7. The semiconductor device as claimed in claim 1, wherein the second semiconductor diode element comprises intrinsic semiconductor or undoped semiconductor.

8. The semiconductor device as claimed in claim 1, wherein the third semiconductor diode element comprises a second type doped semiconductor.

9. The semiconductor device as claimed in claim 8, wherein the third semiconductor diode element is formed by implanting a second type dopant in an intrinsic semiconductor.

10. The semiconductor device as claimed in claim 8, wherein the first semiconductor diode element is a line shape, and the second semiconductor diode element and the third semiconductor diode are in a pillar shape.

11. A semiconductor device, comprising:
a semiconductor substrate;
a first dielectric layer with a first conductor line along a first direction disposed on the semiconductor substrate, wherein the top surface of the first conductor line is lower than the top surface of the first dielectric layer;
a second dielectric layer comprising a first opening and a second opening disposed on the first dielectric layer;
a first semiconductor diode component comprising:
    a first diode element disposed on the first conductor line, wherein the top surface of the first diode element is level with the top surface of the first dielectric layer; and
    a second diode element and a third diode element filled in the first opening;
a second semiconductor diode component comprising:
    a fourth diode element disposed on the first conductor line, wherein the top surface of the fourth diode element is level with the top surface of the first dielectric layer;
    a fifth diode element and a sixth diode element filled in the second opening.

12. The semiconductor device as claimed in claim 11, wherein the first diode element and the fourth diode element are inversely doped silicon regions, and wherein the third diode element and the sixth diode element are inversely doped silicon regions.

13. A method for fabricating a semiconductor device, comprising:
providing a semiconductor substrate;
forming a first dielectric layer with a first conductor line along a first direction on the semiconductor substrate, wherein the top surface of the first conductor line is lower than the top surface of the first dielectric layer;
forming a semiconductor diode component, comprising:
    forming a first semiconductor diode element on the first semiconductor conductor line, wherein the top surface of the first semiconductor diode element is level with the top surface of the first dielectric layer;
    forming a second dielectric layer on the first dielectric layer, the second dielectric layer comprising an opening corresponding to the first semiconductor diode element; and
    filling the opening with a second semiconductor diode element and a third semiconductor diode element.

14. The method as claimed in claim 13, wherein the formation of a first dielectric layer with a first conductor line comprises:
forming the first dielectric layer with a trench therein;
conformably depositing a buffer layer and a first conductive layer on the first dielectric layer filling the trench;
planarizing the buffer layer and the first conductive layer until exposing the first dielectric layer; and
etching the buffer layer and the first conductive layer such that the top surface of the first conductor line is lower than the top surface of the first dielectric layer.

15. The method as claimed in claim 14, wherein the buffer layer comprises TiN, Ta, TaN, AlN, TiAlN, or combination thereof.

16. The method as claimed in claim 14, wherein the first conductive layer comprises tungsten (W), aluminum (Al), copper (Cu), metal silicide, undoped silicon or a doped silicon layer.

17. The method as claimed in claim 14, wherein planarization of the buffer layer and the first conductive layer is performed by chemical mechanical planarization (CMP).

18. The method as claimed in claim 14, wherein planarization of the buffer layer and the first conductive layer is performed by an etching back process.

19. The method as claimed in claim 13, wherein a step height between the first conductor line and the first dielectric layer is less than 1000 Å.

20. The method as claimed in claim 13, wherein the semiconductor diode component comprises a PIN diode.

21. The method as claimed in claim 13, wherein the first semiconductor diode element comprises a first type doped semiconductor.

22. The method as claimed in claim 13, wherein formation of the first semiconductor diode element on the first conductor line comprises:
conformably depositing a buffer layer and a first type doped semiconductor layer on the first dielectric layer; and
planarizing the buffer layer and the first type doped semiconductor layer until exposing the first dielectric layer, thereby the top surface of the first type doped semiconductor is level with the top surface of the first dielectric layer.

23. The method as claimed in claim 22, wherein planarization of the buffer layer and the first type doped semiconductor layer is performed by chemical mechanical planarization (CMP).

24. The method as claimed in claim 22, wherein planarization of the buffer layer and the first conductive layer is performed by an etching back process.

25. The method as claimed in claim 13, wherein the second semiconductor diode element comprises intrinsic semiconductor or undoped semiconductor.

26. The method as claimed in claim 13, wherein the third semiconductor diode element comprises a second type doped semiconductor.

27. The method as claimed in claim 13, wherein the first semiconductor diode element and the third semiconductor diode element are inversely doped silicon regions.

28. The method as claimed in claim 26, wherein the third semiconductor diode element is formed by implanting a second type dopant in an intrinsic semiconductor.

29. A method for fabricating a semiconductor device, comprising:
providing a semiconductor substrate;
forming a first dielectric layer with a trench therein;
conformably depositing a buffer layer and a first conductive layer on the first dielectric layer filling the trench;
planarizing the buffer layer and the first conductive layer until exposing the first dielectric layer; and
etching the buffer layer and the first conductive layer such that the top surface of the first conductor line is lower than the top surface of the first dielectric layer;
forming a first diode element on the first conductor line, wherein the top surface of the first diode element is level with the top surface of the first dielectric layer;
forming a second dielectric layer on the first dielectric layer, the second dielectric layer comprising an opening corresponding to the first diode element; and
filling the opening with a second diode element and a third diode element.

30. The method as claimed in claim 29, wherein the first conductor line and first diode element are formed by a two step damascene process or a multi step damascene process.

* * * * *